United States Patent
Farooq

(10) Patent No.: US 8,128,868 B2
(45) Date of Patent: Mar. 6, 2012

(54) GRAIN REFINEMENT BY PRECIPITATE FORMATION IN PB-FREE ALLOYS OF TIN

(75) Inventor: Mukta G. Farooq, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 12/605,393

(22) Filed: Oct. 26, 2009

(65) Prior Publication Data

US 2010/0200988 A1    Aug. 12, 2010

Related U.S. Application Data

(60) Provisional application No. 61/151,861, filed on Feb. 12, 2009.

(51) Int. Cl.
*C22C 13/00* (2006.01)
(52) U.S. Cl. .......................... 420/557; 420/589
(58) Field of Classification Search ............. 228/262.31, 228/262.21, 262.9; 148/678; 420/557, 589
See application file for complete search history.

(56) References Cited

U.S. PATENT DOCUMENTS

| | | | |
|---|---|---|---|
| 6,471,115 B1 * | 10/2002 | Ijuin et al. ................ | 228/180.22 |
| 6,569,262 B1 | 5/2003 | Shohji | |
| 6,630,251 B1 | 10/2003 | Carter et al. | |
| 6,656,422 B2 * | 12/2003 | Masuda ..................... | 420/557 |
| 6,811,892 B2 | 11/2004 | Yeh et al. | |
| 6,908,517 B2 | 6/2005 | Segal et al. | |
| 7,172,643 B2 | 2/2007 | Shohji | |
| 7,224,067 B2 | 5/2007 | Suh | |
| 7,511,232 B2 * | 3/2009 | Hata et al. ................ | 174/536 |
| 2008/0164488 A1 * | 7/2008 | Ikeda et al. ............... | 257/99 |
| 2009/0014746 A1 * | 1/2009 | Ramirez et al. ............ | 257/99 |
| 2011/0101405 A1 * | 5/2011 | Chang et al. .............. | 257/99 |
| 2011/0133331 A1 * | 6/2011 | Lin et al. .................. | 257/737 |

FOREIGN PATENT DOCUMENTS

JP         7178587         7/1995

* cited by examiner

*Primary Examiner* — S. V Clark
(74) *Attorney, Agent, or Firm* — Scully, Scott, Murphy & Presser, P.C.; Katherine S. Brown, Esq.

(57) ABSTRACT

Micro-addition of a metal to a Sn-based lead-free C4 ball is employed to enhance reliability. Specifically, a metal having a low solubility in Sn is added in a small quantity corresponding to less than 1% in atomic concentration. Due to the low solubility of the added metal, fine precipitates are formed during solidification of the C4 ball, which act as nucleation sites for formation multiple grains in the solidified C4 ball. The fine precipitates also inhibit rapid grain growth by plugging grain boundaries and act as agents for pinning dislocations in the C4 ball. The grain boundaries enable grain boundary sliding for mitigation of stress during thermal cycling of the semiconductor chip and the package on the C4 ball. Further, the fine precipitates prevent electromigration along the grain boundaries due to their pinned nature.

20 Claims, 4 Drawing Sheets

GRAIN REFINEMENT BY PRECIPITATE FORMATION IN PB-FREE ALLOYS OF TIN

BENEFIT CLAIMS

This non-provisional application claims the benefit of the provisional application filed with the U.S. Patent and Trademark Office as Ser. No. 61/151,861 entitled "GRAIN REFINEMENT BY PRECIPITATE FORMATION IN Pb-FREE ALLOYS OF TIN", filed Feb. 12, 2009.

RELATED APPLICATIONS

The present application is related to co-pending U.S. application Ser. No. 12/704,592, which is incorporated herein by reference.

FIELD OF THE INVENTION

The present invention relates to metallic alloys, and particularly to lead-free alloys of tin that may be employed in a Controlled Collapse Chip Connection (C4) ball. The present invention also relates to structures employing the same, and methods of forming the same.

BACKGROUND OF THE INVENTION

Once formation of semiconductor devices and interconnects on a semiconductor wafer (substrate) is completed, the semiconductor wafer is diced into semiconductor chips, or "dies." Functional semiconductor chips are then packaged to facilitate mounting on a circuit board. A package is a supporting element for the semiconductor chip that provides mechanical protection and electrical connection to an upper level assembly system such as the circuit board. One typical packaging technology is Controlled Collapse Chip Connection (C4) packaging, which employs C4 balls each of which contacts a pad on the semiconductor chip and another C4 pad on a packaging substrate. The packaging substrate may then be assembled on the circuit board.

Thus, the packaging substrate facilitates formation of an electrical link between the semiconductor chip and a system board of a computer. A semiconductor chip is mounted on a die foot print area located on a top surface of the packaging substrate. The die foot print area contains C4 pads on which a semiconductor chip may be attached by C4 bonding.

A typical semiconductor chip employing a packaging substrate may comprise about 5,000 input/output nodes. Each of these nodes is electrically connected to a C4 pad on a top surface of the semiconductor chip in a two dimensional array. Typical two dimensional array configurations for the C4 pads include 4 on 8 configuration, which employs C4 solder balls having a diameter of 4 mils (approximately 100 microns) and a pitch of 8 mils (approximately 200 microns) in a rectangular array, and 3.0 on 6 configuration, which employs C4 solder balls having a diameter of 3.0 mils (approximately 75 microns) and a pitch of 6 mils (approximately 150 microns) in a rectangular array. Thus, more than 5,000 C4 solder balls may be formed on the semiconductor chip, which may be typically about 2 cm×2 cm in size.

Use of lead free-alloys for C4 balls is increasing to reduce environmental impacts. Plating or mold-transfer processes may be employed to form the C4 balls. Typical prior art alloy compositions for lead-free C4 balls include a Sn—Ag alloy (with an atomic concentration of Ag in the range from about 0.1% to about 2.3%, and typically from about 0.5% to about 1.1%, the balance being Sn), a Sn—Cu alloy (with an atomic concentration of Cu in the range 0.5% to 0.7%, the balance being Sn), a Sn—Ag—Cu (atomic concentration of Ag in the range from about 0.1% to about 2.3%, and typically from about 0.5% to about 1.1% and atomic concentration of Cu in the range 0.5% to 0.7%, the balance being Sn). These alloys are therefore Sn-rich, i.e., contains Sn at an atomic concentration above 95%.

Upon solidification, the prior art alloy materials tend to form large grains in the lead-free C4 balls. The number of grains in the solidified lead-free C4 balls is correspondingly small, e.g., typically from 1 to 5, and more typically from 1 to 3. The tendency to form very few grains, e.g., from 1 to 3 grains within the entirety of a solidified lead-free C4 ball is further exacerbated by a slow cool down process that is employed to reduce the transient stresses on the chip which would otherwise arise, i.e., if the lead-free C4 balls were rapidly quenched. Such slow cool down processes are increasingly required to mitigate back-end-of line (BEOL) stresses such as structural back end damage resulting in separation of the C4 balls from a semiconductor chip. This phenomenon is sometimes referred to as "white bumps" because when the chip is scanned using ultrasound waves, damaged areas under C4s which are areas of delamination, show up as white spots rather than as dark spots. Dark spots typically correspond to areas without delamination or other damage in the vicinity of the C4.

The tendency to form very few grains is further exacerbated by recent trends in the composition of the prior art alloy materials, in which the alloy composition is moving closer to pure Sn for reasons related to BEOL stress build-up. In this case, pure metals provide lower yield strength than an alloy of that metal with other metals. The lower the content of the other metals, the lower the yield strength of the alloy. For example, a Sn—Ag alloy containing Ag at an atomic concentration of 0.5% has a lower yield strength than a Sn—Ag alloy containing Ag at an atomic concentration of 1.1%. The low yield strength helps reduce the effective stress on the semiconductor chip during the reflow by accommodating stress by deformation within the lead-free C4 ball. However, as the alloy approaches pure Sn in composition, grain growth occurs more readily resulting in fewer grain boundaries under similar reflow conditions. This is disadvantageous to the stress mitigation in the lead-free C4 balls during subsequent thermal cycling since fewer grain boundaries are available for grain boundary sliding, which is a mechanism to mitigate stress in the lead-free C4 balls.

Further, additional thermal processes that the semiconductor chip is subjected to, including ball grid array (BGA) join, BGA join rework if applicable, card join, card join rework if applicable, lid join, lid join rework if applicable, facilitate grain growth in the lead-free C4 ball. This tendency is more pronounced in the lead-free C4 balls, which are Sn-based, than in lead-based C4 balls due to the differences in the homologous temperatures.

Thus, formation of a small number of grains in the lead-free C4 ball, e.g., 1 or 2, creates more stress on the semiconductor chip than formation of a large number of grains in the lead-free C4 ball, all other parameters for the C4 balls being equal. This is because grain boundary sliding is not possible with 1 grain to provide stress alleviation, while a many-grained C4 ball containing, for example, 5 or 10 grains per C4 ball, is conducive to stress-mitigation within the C4 ball so that less stress is transmitted into the semiconductor chip thereupon.

In view of the above, there exists a need for an alloy composition that induces multiple grains per C4 ball without requiring modification in any processing temperature or conditions, structures for effecting the same, and methods for effecting the same.

SUMMARY OF THE INVENTION

The present invention addresses the needs described above by providing an alloy composition for a C4 ball that results in formation of fine precipitates after solidification, thereby inducing formation of small grains within the C4 ball, structures for the same, and methods for forming the same.

The present invention employs micro-addition of a metal having a low solubility in Sn to a Sn-based lead-free C4 ball. The metal is added in a small quantity corresponding to less than 1% in atomic concentration. Due to the low solubility of the added metal, fine precipitates are formed during solidification of the C4 ball, which act as nucleation sites for formation of multiple grains in the solidified C4 ball. The fine precipitates also inhibit rapid grain growth by plugging grain boundaries and act as agents for pinning dislocations in the C4 ball. The grain boundaries enable grain boundary sliding for mitigation of stress during thermal cycling of the semiconductor chip and the package on the C4 ball. Further, the fine precipitates prevent electromigration along the grain boundaries due to their pinned nature.

According to one aspect of the present invention, a metallic ball is provided, which comprises, consists essentially of, or consists of:
  a. at least one metal selected from Au, Pd, and Pt, and having an atomic concentration greater than 0% and less than 5%; and
  b. Sn at an atomic concentration of at least 95%.

The metallic ball may be a solder ball. Particularly, the metallic ball may be a Controlled Collapse Chip Connection (C4) ball located on a semiconductor chip and employed for physically and electrically connecting the semiconductor chip to a chip package.

In one embodiment, Sn comprises a balance composition of the at least one metal.

In another embodiment, the metallic ball further comprises at least another metal at an atomic concentration less than 3.4%.

The at least one metal may include Au at an atomic concentration greater than 0% and less than 3.0%. Further, the atomic concentration of Au in the metallic ball may be greater than 0.20% and less than 1.0%.

The at least one metal may include Pd at an atomic concentration greater than 0% and less than 3.0%. Further, the atomic concentration of Pd in the metallic ball may be greater than 0.22% and less than 1.0%.

The at least one metal may include Pt at an atomic concentration greater than 0% and less than 3.0%. Further, the atomic concentration of Pt in the metallic ball may be greater than 0.10% and less than 1.0%.

The at least one metal may include Ag at an atomic concentration from about 0.1% to about 2.3%. The at least one metal may include Cu at an atomic concentration from about 0.1% to about 1.0%.

The metallic ball may be a Controlled Collapse Chip Connection (C4) ball having a diameter from about 10 microns to about 200 microns.

In yet another embodiment, all of the at least one metal is present in the metallic ball as fine precipitates in grain boundaries between regions comprising Sn.

According to another aspect of the present invention, a semiconductor structure is provided, which comprises:

a. a metal interconnect structure located on a semiconductor substrate;
  b. a Controlled Collapse Chip Connection (C4) pad located on the metal interconnect structure;
  c. a C4 ball located directly on the C4 pad and comprising:
    i. at least one metal selected from Au, Pd, and Pt, and having an atomic concentration greater than 0% and less than 5%; and
    ii. Sn at an atomic concentration of at least 95%.

According to yet another embodiment of the present invention, a method of forming a semiconductor structure is provided, which comprises:
  a. applying a Controlled Collapse Chip Connection (C4) ball on a metallic pad, wherein the C4 ball comprises Sn at an atomic concentration of at least 95% and at least one metal selected from Au, Pd, and Pt, wherein each of the at least one metal has an atomic concentration greater than 0% and less than 5%; and
  b. reflowing the C4 ball at an elevated temperature, thereby inducing formation of precipitates of the at least one metal at grain boundaries within the C4 ball.

In one embodiment, the C4 ball is reflowed at a temperature from about 200° C. to about 260° C.

The C4 ball may have the same composition as the metallic ball described above.

DETAILED DESCRIPTION OF THE INVENTION

As stated above, the present invention relates to lead-free alloys of tin that may be employed in a Controlled Collapse Chip Connection (C4) ball, and structures for employing the same, and methods of forming the same, which are now described in detail with accompanying figures.

Figure 1:
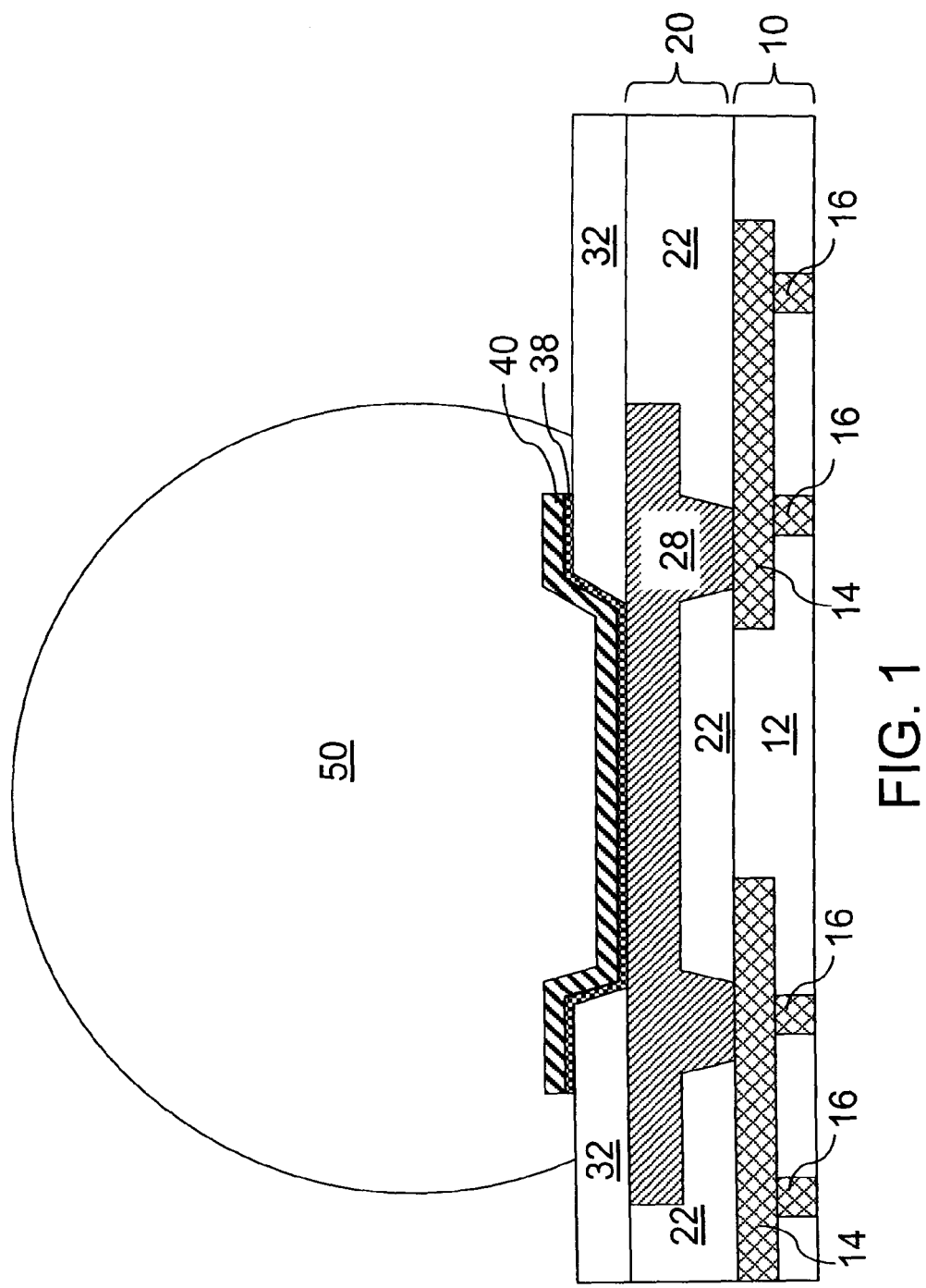
FIG. 1 shows a vertical cross-sectional view of an exemplary semiconductor structure according to the present invention.

Referring to FIG. 1, an exemplary semiconductor structure is shown in which a metallic ball of the present invention is employed as a C4 ball. The exemplary semiconductor structure is a non-limiting example of uses of the metallic ball of the present invention, which may be employed in any structure requiring solder of one structure to another. While the present invention is described employing the exemplary semiconductor structure, the metallic ball of the present invention may be employed in any such structures to reduce the effect of coefficient of temperature expansion (CTE) mismatch stress or other mechanical stress, and/or to reduce electromigration within the metallic ball. Such variations are explicitly contemplated herein.

The exemplary semiconductor structure comprises a back-end-of-line (BEOL) interconnect structure 10, a last level interconnect structure 20, and a dielectric passivation layer 32 that are formed on a semiconductor substrate (not shown). Semiconductor devices (not shown) are formed on the semiconductor substrate by employing semiconductor manufacturing processes known in the art. Typically, additional BEOL interconnect structures (not shown) are present between the semiconductor devices and the BEOL interconnect structure 10. The additional BEOL interconnect structures facilitate wiring of the semiconductor devices.

The BEOL interconnect structure 10 includes a back-end-of-line (BEOL) dielectric layer 12, back-end-of-line (BEOL) metal lines 14, and back-end-of-line (BEOL) metal vias 16. The BEOL metal lines 14 and the BEOL metal vias 16 are embedded in the BEOL dielectric layer 12. The BEOL dielectric layer may comprise silicon oxide or a low-k dielectric material known in the art. The BEOL metal lines 14 and the BEOL metal via 16 comprise a conductive metal such as Cu, and are formed by methods well known in the art.

The last level interconnect structure 20 includes a last level dielectric layer 22 and a last level metal plate 28. The last level dielectric layer 22 comprises a dielectric material such as silicon oxide. The last level metal plate 28 comprises a metal such as aluminum. Typically, the last level metal plate 28 is integrally formed with at least one via that electrically connects the last level metal plate 28 with the BEOL metal lines 14.

The dielectric passivation layer 32 comprises an impervious dielectric material that blocks ingress of moisture and oxygen into the last level interconnect structure 20. Exemplary impervious dielectric materials include silicon nitride. The dielectric passivation layer 32 may be a homogeneous layer comprising the impervious dielectric material, or may be a stack of multiple dielectric material layers including an impervious dielectric material layer. The thickness of the dielectric passivation layer 32 may be from about 2.0 µm to about 40 µm, and typically from about 4.0 µm to about 20 µm. Organic materials may be included in the dielectric passivation layer 32.

The dielectric passivation layer 32 has an opening that exposes a top surface of the last level metal plate 28. The dimension of the opening, e.g., a diameter of the opening, may be from about 20 µm to about 300 µm, and typically from about 50 µm to about 100 µm. The opening is formed by lithographic patterning of a photosensitive resist that is removed after patterning of the opening, or a photosensitive polyimide which may form a part of the passivation layer 32.

A metallic adhesion layer and/or a diffusion barrier layer is deposited by chemical vapor deposition (CVD) or physical vapor deposition (PVD), i.e., sputtering. The metallic adhesion layer comprises a metallic material that provides good adhesion to underlying structures including the last level metal plate 28 and the dielectric passivation layer 32. Exemplary materials for the metallic adhesion layer comprise Ti, TiN, and TiW. The thickness of the metallic adhesion layer may be from about 100 nm to about 500 nm, although lesser and greater thicknesses are also explicitly contemplated herein.

A metal pad layer is formed directly on the metallic adhesion layer by sputtering, i.e., physical vapor deposition, by plating, or by a combination thereof. The metal pad layer may comprise Ni, Cu, or an alloy thereof, and has a thickness from about 1 µm to about 10 µm, and typically from about 1.5 µm to about 5.0 µm, although lesser and greater thicknesses are contemplated herein also.

The metallic adhesion layer and the metal pad layer are lithographically patterned to form a metallic adhesion portion 38 and a metal pad portion 40. The metallic adhesion portion 38 and the metal pad portion 40 collectively constitute a C4 pad (38, 40).

A C4 ball 50 is applied to each C4 pad within a semiconductor chip. The C4 ball 50 directly contacts a top surface of the C4 pad (38, 40). The C4 ball 50 may directly contact a portion of the passivation layer 32 along the periphery of the C4 pad (38, 40). The diameter of the C4 ball may be from about 10 µm to about 200 µm, and typically from about 50 µm to about 100 µm, although lesser and greater diameters are contemplated herein also. The C4 ball 50 may be a perfect sphere, an oblate ellipsoid, a prolate ellipsoid, a scalene ellipsoid, a superellipsoid, or in general any set of convex surfaces constituting a closed three dimensional volume. Further, the shape of the C4 ball 50 may be modified by the structure of the surface abutting the C4 ball 50 such as the shape of the C4 pad (38, 40). In case the C4 ball 50 is not a perfect sphere, the term, "diameter" is used herein to denote the greatest dimension across the C4 ball 50 between two surfaces of the C4 ball 50.

According to the present invention, the C4 ball 50 comprises a Sn-based lead-free solder containing at least one of Au, Pd, and Pt. The added metal(s), i.e., the at least one of Au, Pd, and Pt, is/are herein collectively referred to as a "precipitate-inducing metal" since precipitates of the added metal are induced in the C4 ball 50 after "reflow" or solidification. At least one of Au, Pd, and Pt is added to the composition of the Sn-based lead-free solder by micro-addition, i.e., an addition in a small quantity. The percentage of the at least one of Au, Pd, and Pt is less than 5% in atomic concentration within the Sn-based lead-free solder. The atomic percentage of Sn is at least 95%. The atomic percentage of the precipitate-inducing metal is greater than 0% and less than 5%. The precipitate-inducing metal may comprise only one of Au, Pd, and Pt, or two of Au, Pd, and Pt, or all three of Au, Pd, and Pt.

The percentage of each of Au, Pd, and Pt is set such that fine precipitates may be induced between grain boundaries of Sn-containing regions in the C4 ball during the reflow, which is effected by subjecting the exemplary semiconductor structure to an anneal at an elevated temperature, followed by cooling of the exemplary semiconductor structure. In the present invention, a fine precipitate denotes a region of intermetallic compounds located in a grain boundary region between Sn-containing regions. The intermetallic compounds comprise Sn and at least one of Au, Pd, and Pt. Specifically, the intermetallic compounds are in the intermetallic phases shown in the phase diagrams of FIGS. 2-4. The dimensions of a fine precipitate are less than 10 microns in all directions, and typically less than 3 microns in all directions. Consequently, the distance between neighboring Sn-containing regions is less than the greatest dimension of the fine precipitates, i.e., less than 10 microns, and typically less than 3 microns. A plurality of fine precipitates may be formed along grain boundaries between Sn-containing regions.

The solubility of Au, Pd, and Pt in Sn is very low. Specifically, the solubility of Au in Sn is 0.20 atomic percent at 200° C., and is lower at room temperature. The solubility of Pd in Sn is practically nil, i.e., less than 0.1 atomic percent. The solubility of Pt is Sn is also practically nil, i.e., less than 0.1 atomic percent.

Figure 2:
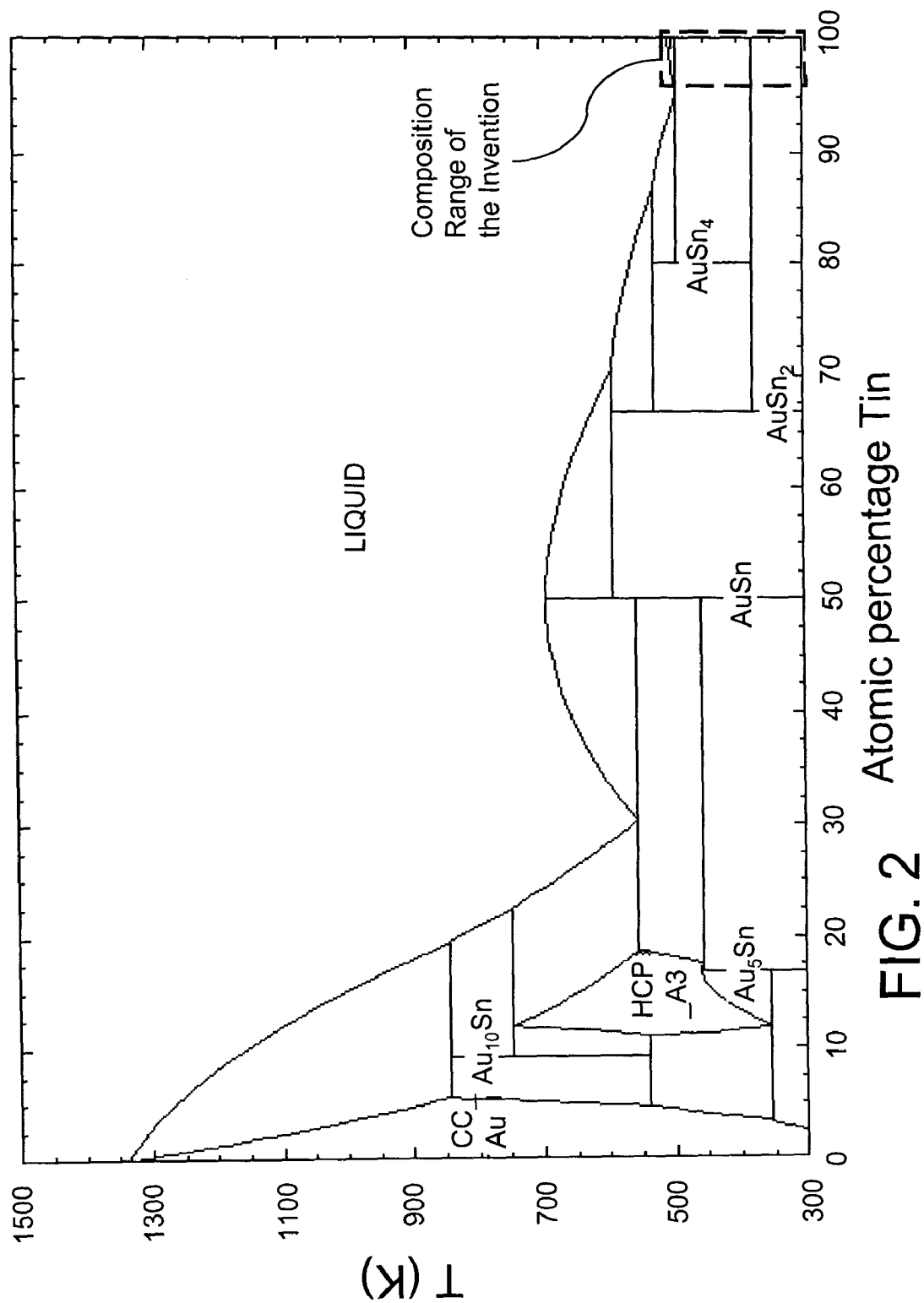
FIG. 2 shows a phase diagram for Au—Sn alloy system and a composition range for a C4 ball employed in the present invention.

Referring to FIG. 2, a phase diagram for Au—Sn alloy system is shown. The x-axis represents atomic percentage tin, which is the mole fraction of Sn in percentage. The y-axis represents temperature in Kelvin. Five phases including $Au_{10}Sn$, $Au_5Sn$, $AuSn$, $AuSn_2$, and $AnSn_4$ are seen among others. Micro-addition, i.e., addition in a small percentage, of Au at an atomic concentration from 0% to about 3.0% does not cause formation of any stoichiometric alloys of Au and Sn upon reflow, but results in formation of precipitates of Au in a Sn-based metallic ball upon solidification.

In case the precipitate-inducing metal comprises Au in a lead-free Sn-based C4 ball, the atomic concentration of Au is greater than 0% and less than 3.0%. Preferably, the atomic concentration of Au in the Sn-based metallic ball is greater than the solubility of Au in Sn, i.e., greater than 0.20%. Another consideration in the optimization of the concentration of the Au in the Sn-based metallic ball is the impact of the Au concentration on mitigation of stress on the structures attached to the Sn-based metallic ball, e.g., the semiconductor structures in FIG. 1, during the solidification of the Sn-based metallic ball. For this purpose, a relatively low atomic concentration range may be employed for Au in the Sn-based metallic ball. A preferred range for the atomic concentration of Au is from about 0.20% to about 1.0%, although atomic concentrations of Au outside this range may be employed to practice the present invention.

Figure 3:
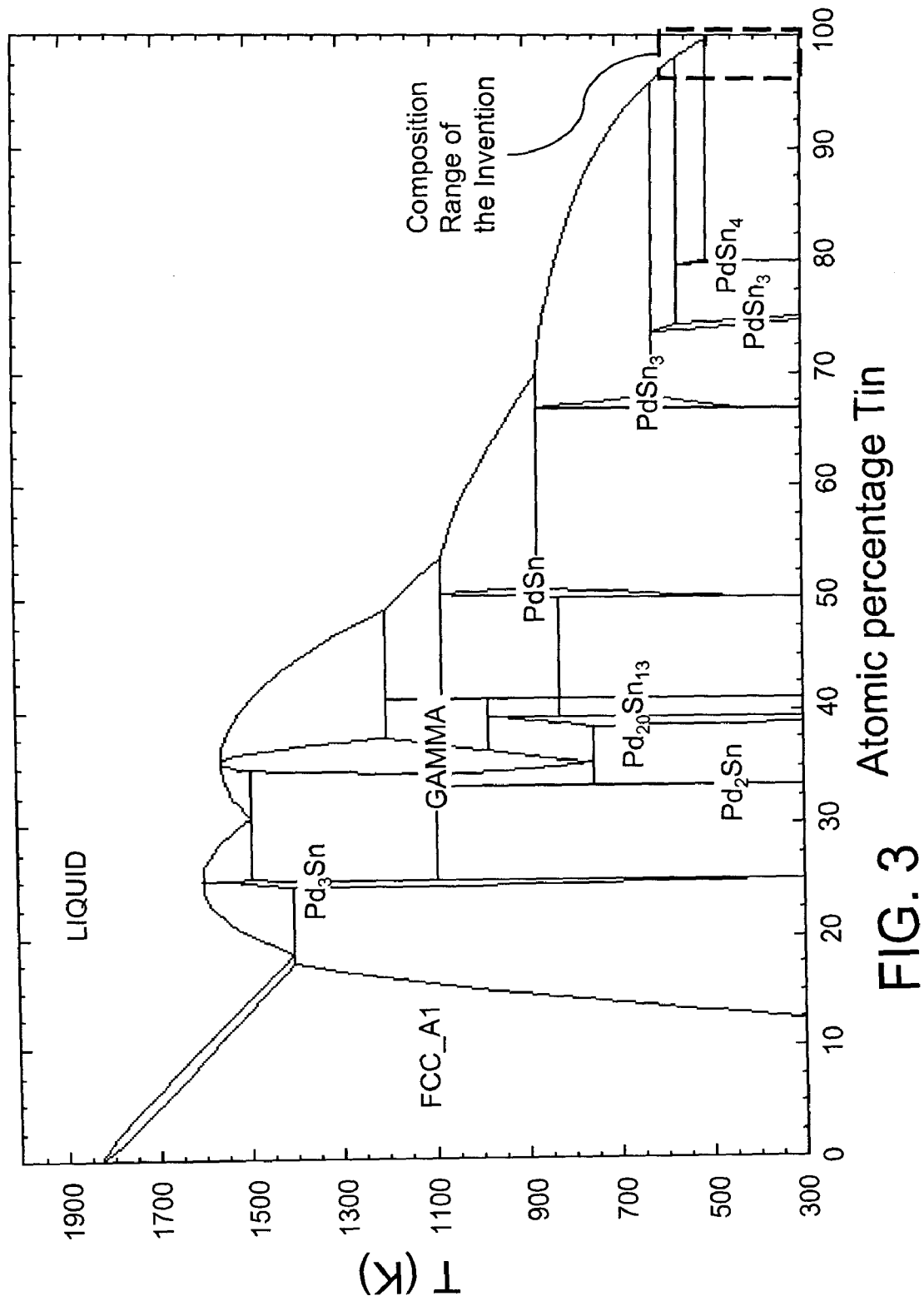
FIG. 3 shows a phase diagram for Pd—Sn alloy system and a composition range for a C4 ball employed in the present invention.

Referring to FIG. 3, a phase diagram for Pd—Sn alloy system is shown. The x-axis represents atomic percentage tin, which is the mole fraction of Sn in percentage. The y-axis represents temperature in Kelvin. Six phases including $Pd_3Sn$, $Pd_2Sn$, $Pd_{20}Sn_{13}$, PdSn, $PdSn_3$, and $PdSn_4$ are seen in this system among others. The Sn—Pd alloy system forms a eutectic at 0.22% of atomic concentration of Pd at a temperature 0.6° C. below the melting point of Sn (232° C.). Microaddition of Pd at an atomic concentration from 0% to about 3.0% does not cause formation of any stoichiometric alloys of Pd and Sn upon reflow, but results in formation of precipitates of Pd in a Sn-based metallic ball upon solidification.

In case the precipitate-inducing metal comprises Pd in a lead-free Sn-based metal ball, the atomic concentration of Pd is greater than 0% and less than 3.0%. Preferably, the atomic concentration of Pd in the Sn-based metallic ball is greater than the eutectic concentration, i.e., greater than 0.22%. Another consideration in the optimization of the concentration of the Pd in the Sn-based metallic ball is the impact of the Pd concentration on mitigation of stress on the structures attached to the Sn-based metallic ball, e.g., the semiconductor structures in FIG. 1, during the solidification of the Sn-based metallic ball. For this purpose, a relatively low atomic concentration range may be employed for Pd in the Sn-based metallic ball. A preferred range for the atomic concentration of Pd is from about 0.22% to about 1.0%, although atomic concentrations of Pd outside this range may be employed to practice the present invention.

Figure 4:
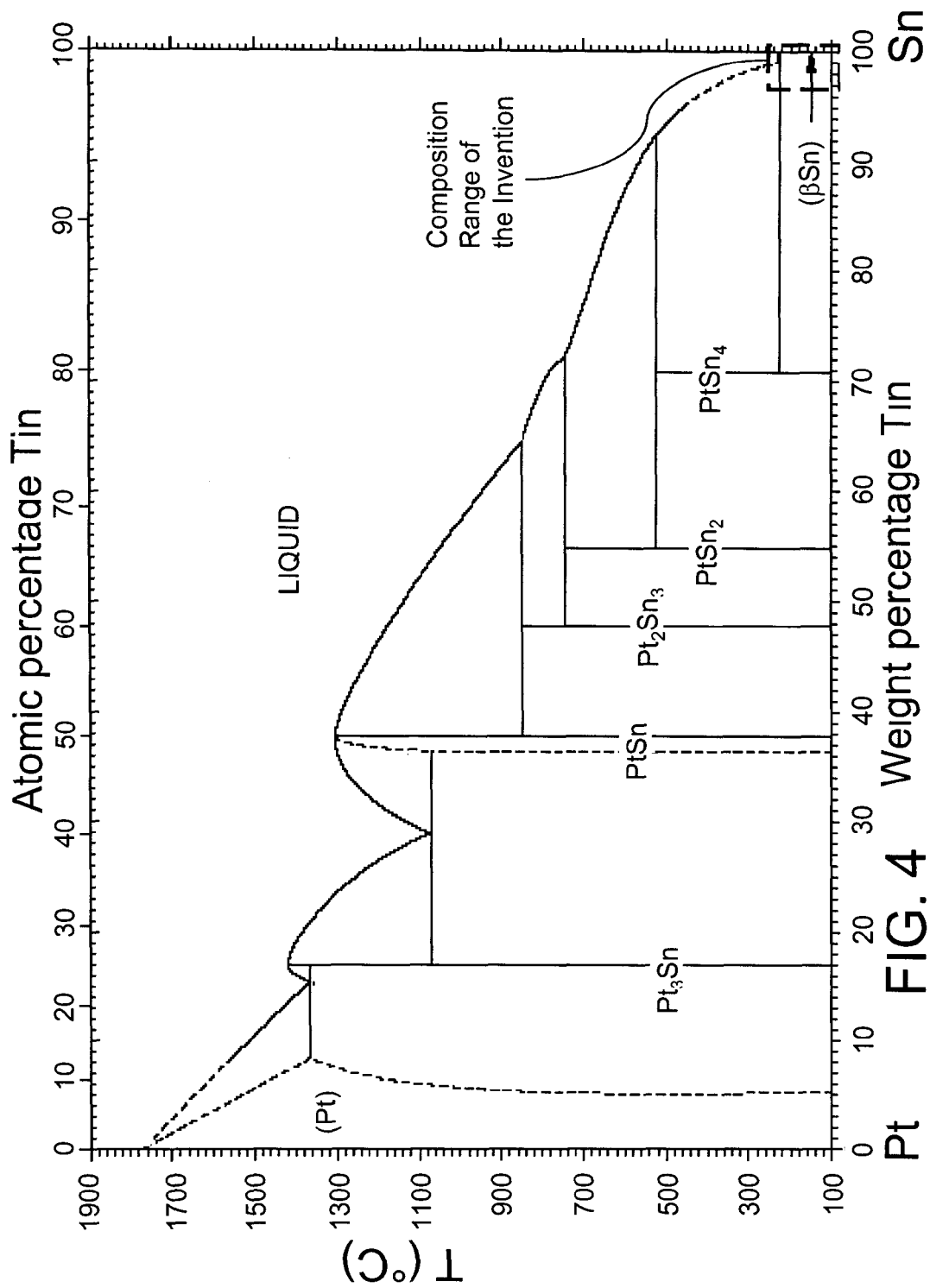
FIG. 4 shows a phase diagram for Pt—Sn alloy system and a composition range for a C4 ball employed in the present invention.

Referring to FIG. 4, a phase diagram for Pt—Sn alloy system is shown. The x-axis represents atomic percentage tin, which is the mole fraction of Sn in percentage. The y-axis represents temperature in degree Celsius. Five phases including $Pt_3Sn$, PtSn, $Pt_2Sn_3$, $PtSn_2$, and $PtSn_4$ are seen in this system among other phases. Micro-addition of Pt at an atomic concentration from 0% to about 3.0% does not cause formation of any stoichiometric alloys of Pd and Sn upon reflow, but results in formation of precipitates of Pd in a Sn-based metallic ball upon solidification.

In case the precipitate-inducing metal comprises Pt in a lead-free Sn-based metal ball, the atomic concentration of Pt is greater than 0% and less than 3.0%. Preferably, the atomic concentration of Pt in the Sn-based metallic ball is greater than the solubility of Pt in Sn, and is preferably greater than 0.10%. Another consideration in the optimization of the concentration of the Pt in the Sn-based metallic ball is the impact of the Pt concentration on mitigation of stress on the structures attached to the Sn-based metallic ball, e.g., the semiconductor structures in FIG. 1, during the solidification of the Sn-based metallic ball. For this purpose, a relatively low atomic concentration range may be employed for Pt in the Sn-based metallic ball. A preferred range for the atomic concentration of Pt is from about 0.10% to about 1.0%, although atomic concentrations of Pt outside this range may be employed to practice the present invention.

Each of Au, Pd, and Pt may be added to Sn singly, in combination among the group of Au Pd, and Pt, in combination with at least one metal other than Au Pd, and Pt, or in combination among the group of Au Pd, Pt and at least one metal other than Au Pd, and Pt. At least one of Au, Pd, and Pt is added to Sn. The total atomic concentration of the added metals is less than 5.0% in atomic concentration, Sn being the balance metal. In other words, the atomic concentration of Sn in the lead-free metallic ball is greater than 95%.

In one embodiment, the lead-free metallic ball consists of Sn and at least one of Au, Pd, and Pt. The lead-free metallic ball may then be a Sn—Au alloy, a Sn—Pd alloy, a Sn—Pt alloy, a Sn—Au—Pd alloy, a Sn—Au—Pt alloy, a Sn—Pd—Pt alloy, or a Sn—Au—Pd—Pt alloy. The atomic concentration of Sn is greater than 95%, and preferably greater than 97%.

In another embodiment, the lead-free metallic ball comprises Sn and at least one of Au, Pd, and Pt and at least one metal that is not Sn, Au, Pd, or Pt. Typical at least one metal that may be added to the composition of the lead-free metallic ball of the present invention include Ag and Cu. In case Ag is added to the lead-free metallic ball, the atomic concentration of Ag may be from about 0.1% to about 2.3%, and preferably from about 0.5% to about 1.1%. In case Cu is added to the lead-free metallic ball, the atomic concentration of Cu may be from about 0.1% to about 1.0%, and typically from about 0.5% to about 0.7%. The lead-free metallic ball may further comprise another metal at an atomic concentration so long as the atomic concentration of Sn is greater than 95%. The lead-free metallic ball may then be a Sn—Au—Ag alloy, a Sn—Pd—Ag alloy, a Sn—Pt—Ag alloy, a Sn—Au—Pd—Ag alloy, a Sn—Au—Pt—Ag alloy, a Sn—Pd—Pt—Ag alloy, a Sn—Au—Pd—Pt—Ag alloy, a Sn—Au—Cu alloy, a Sn—Pd—Cu alloy, a Sn—Pt—Cu alloy, a Sn—Au—Pd—Cu alloy, a Sn—Au—Pt—Cu alloy, a Sn—Pd—Pt—Cu alloy, or a Sn—Au—Pd—Pt—Cu alloy, a Sn—Au—Ag—Cu alloy, a Sn—Pd—Ag—Cu alloy, a Sn—Pt—Ag—Cu alloy, a Sn—Au—Pd—Ag—Cu alloy, a Sn—Au—Pt—Ag—Cu alloy, a Sn—Pd—Pt—Ag—Cu alloy, a Sn—Au—Pd—Pt—Ag—Cu alloy, or any alloy comprising one of the previously listed alloys and at least another metal different from Sn, Pd, Pt, Ag, and Cu provided that the atomic concentration of Sn is greater than 95%. Preferably, the atomic concentration of Sn is greater than 97%.

The lead-free metallic ball is subjected to an anneal at an elevated temperature to induce crystallization with accompanying deformation, or "reflowed" at the elevated temperature. For example, the C4 ball 50 of the exemplary semiconductor structure in FIG. 1 may be reflowed, which enhances adhesion of the C4 ball to C4 pad (38, 40). The reflow of the C4 ball 50 is facilitated by subjecting the C4 ball 50 and the C4 pad (38, 40) to an anneal at an elevated temperature from about 200° C. to about 260° C., and typically from about 220° C. to about 250° C. Typically, the temperature of the anneal is slightly above the liquidus temperature of the alloy comprising the C4 ball 50. The duration of the anneal at the elevated temperature may be from about 1 hour to about 24 hours, and typically from 2 hours to about 12 hours.

During the reflow, an upper portion of the metal pad portion 40 reacts with the material of the C4 ball 50 to form a solder. Further, the composition of the C4 ball 50, which includes Sn and at least one of Au, Pd, and Pt, and optionally includes Ag, Cu, or at least another metal as described above, induces formation of fine precipitates in the solidifying structure, i.e., in the C4 ball 50, as the temperature is gradually lowered in a latter portion of the anneal. Such fine precipitates act as nucleation sites which induces formation of multiple grains in the C4 ball 50 as solidified.

Further, the fine precipitates inhibit rapid grain growth during the cooling process by plugging grain boundaries, and thereby acting as pinning agents for dislocations. In other words, the dislocations do not move freely once the fine precipitates of Au, Pd, or Pt pegs the dislocation to a particular location during the cooling, i.e., during the solidification.

The presence of the fine precipitates and plurality of grains in the C4 ball 50 after solidification provides grain boundaries along which grain boundary sliding may occur during subsequent thermal cycling at a temperature lower than the reflow temperature, which occurs at a temperature less than 180° C., and typically at a temperature less than 125° C. During such thermal cycling below the reflow temperature, the thermal stress on the C4 ball 50 and the structure soldered to the C4 ball 50 is partially absorbed by the grain boundary sliding that occurs in the C4 ball 50 so that the thermal stress exerted on the structure, e.g., a semiconductor chip or a packaging substrate, may be partially mitigated by the C4 ball 50.

In addition, the fine precipitates in the grain boundaries function as a higher resistance conductive path than a grain. In other words, conductive paths from the volume within a grain, passing through the grain boundary in a direction substantially perpendicular to the grain boundary, and into the volume within a neighboring grain provides a lower resistance path than conductive paths connecting the fine grain precipitates along the grain boundary. Thus, diffusion of material along the grain boundary is effectively blocked. Since the grain boundaries are no longer easy conduits of electrical conduction after solidification of a lead-free Sn-based metallic ball, e.g., a C4 ball 50 having the composition described above, of the present invention, electromigration along the grain boundaries are substantially reduced or eliminated. In other words, the grain boundaries are prevented from acting as channels for electromigration. Such a reduction or elimination of electromigration along the grain boundaries may be advantageously employed to enhance the reliability of semiconductor structure employing a C4 ball 50 having a composition according to the present invention, or in any structure employing a lead-free Sn-based metallic ball that are reflowed and solidified to include fine precipitates of Au, Pd, or Pt according to the present invention.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A metallic ball comprising:
at least one metal selected from Pd, and Pt and having an atomic concentration greater than 0% and less than 5%; and
Sn at an atomic concentration of at least 95%, wherein Sn comprises a balance composition of said at least one metal and said at least one metal includes Pd or Pt at an atomic concentration greater than 0% and less than 3.0%.

2. The metallic ball of claim 1, wherein said at least one metal includes Pd at an atomic concentration greater than 0% and less than 3.0%.

3. The metallic ball of claim 2, wherein an atomic concentration of Pd in said metallic ball is greater than 0.22% and less than 1.0%.

4. The metallic ball of claim 1, wherein said at least one metal includes Pt at an atomic concentration greater than 0% and less than 3.0%.

5. The metallic ball of claim 4, wherein an atomic concentration of Pt in said metallic ball is greater than 0.10% and less than 1.0%.

6. A metallic ball comprising:
at least one metal selected from Au, Pd, and Pt and having an atomic concentration greater than 0% and less than 5%;
Sn at an atomic concentration of at least 95%; and
at least another metal at an atomic concentration less than 3.4%.

7. The metallic ball of claim 6, wherein said at least another metal includes Ag at an atomic concentration from about 0.1% to about 2.3%.

8. The metallic ball of claim 6, wherein said at least another metal includes Cu at an atomic concentration from about 0.1% to about 1.0%.

9. A metallic ball comprising:
at least one metal selected from Au, Pd, and Pt and having an atomic concentration greater than 0% and less than 5%; and
Sn at an atomic concentration of at least 95%, wherein said at least one metal is present in said metallic ball as fine precipitates in grain boundaries between Sn-containing regions.

10. The metallic ball of claim 6, wherein Sn comprises a balance composition of said at least one metal.

11. The metallic ball of claim 10, wherein said at least one metal includes Au at an atomic concentration greater than 0% and less than 3.0%.

12. The metallic ball of claim 10, wherein said at least one metal includes Pd at an atomic concentration greater than 0% and less than 3.0%.

13. The metallic ball of claim 10, wherein said at least one metal includes Pt at an atomic concentration greater than 0% and less than 3.0%.

14. The metallic ball of claim 6, wherein said at least one metal is present in said metallic ball as fine precipitates in grain boundaries between Sn-containing regions.

15. The metallic ball of claim 9, wherein Sn comprises a balance composition of said at least one metal.

16. The metallic ball of claim 15, wherein said at least one metal includes Au at an atomic concentration greater than 0% and less than 3.0%.

17. The metallic ball of claim 15, wherein said at least one metal includes Pd at an atomic concentration greater than 0% and less than 3.0%.

18. The metallic ball of claim 15, wherein said at least one metal includes Pt at an atomic concentration greater than 0% and less than 3.0%.

19. The metallic ball of claim 9, further comprising at least another metal at an atomic concentration less than 3.4%.

20. The metallic ball of claim 19, wherein said at least another metal includes Ag at an atomic concentration from about 0.1% to about 2.3% or Cu at an atomic concentration from about 0.1% to about 1.0%.

\* \* \* \* \*